United States Patent
Lee et al.

(10) Patent No.: US 6,965,274 B2
(45) Date of Patent: Nov. 15, 2005

(54) THIN FILM BULK ACOUSTIC RESONATOR FOR CONTROLLING RESONANCE FREQUENCY AND VOLTAGE CONTROLLED OSCILLATOR USING THE SAME

(75) Inventors: Heon Min Lee, Seongnam (KR); Young Joo Yee, Seongnam (KR)

(73) Assignee: LG Electronics Inc., Seoul (KR)

( * ) Notice: Subject to any disclaimer, the term of this patent is extended or adjusted under 35 U.S.C. 154(b) by 72 days.

(21) Appl. No.: 10/600,545

(22) Filed: Jun. 23, 2003

(65) Prior Publication Data

US 2004/0257165 A1    Dec. 23, 2004

(51) Int. Cl.[7] .................. H01L 41/04; H01L 41/08; H03B 5/32; H03H 9/00; H03H 9/02
(52) U.S. Cl. .................. 331/107 A; 331/177 R; 310/328; 310/333; 333/186; 333/187
(58) Field of Search .............. 331/107 R, 108 R, 331/107 A, 177 R; 333/186–192; 310/311, 310/328, 333–334

(56) References Cited

U.S. PATENT DOCUMENTS

| 5,446,306 | A | * | 8/1995 | Stokes et al. ............ 257/416 |
| 6,484,229 | B1 | | 11/2002 | Ichikawa et al. |
| 6,566,979 | B2 | | 5/2003 | Larson, III et al. |
| 6,747,529 | B2 | * | 6/2004 | Abe et al. ............ 333/188 |
| 6,809,604 | B2 | * | 10/2004 | Kawakubo et al. ...... 331/107 A |

OTHER PUBLICATIONS

Abstract for KR 2003083887 A, Lee et al, Nov. 1, 2003.*

* cited by examiner

*Primary Examiner*—David Mis
(74) *Attorney, Agent, or Firm*—Birch, Stewart, Kolasch & Birch, LLP

(57) ABSTRACT

A thin film bulk acoustic resonator device is provided for minimizing phase noise by controlling resonance frequency. The thin film bulk acoustic resonator device comprises: a fixed body having a first electrode; a driving body having a second electrode installed to be adjacent to the fixed body and moved toward the fixed body due to voltage applied to the first and second electrodes; and a thin film bulk acoustic resonator for controlling the resonance frequency according to change of stress generated due to the movement of the driving body.

8 Claims, 3 Drawing Sheets

THIN FILM BULK ACOUSTIC RESONATOR FOR CONTROLLING RESONANCE FREQUENCY AND VOLTAGE CONTROLLED OSCILLATOR USING THE SAME

BACKGROUND OF THE INVENTION

1. Field of the Invention

The present invention relates to a voltage controlled oscillator, and particularly, to a voltage controlled oscillator using a thin film bulk acoustic resonator.

2. Description of the Background Art

Recently, information communication technology is greatly developed due to development of mobile communication terminal. Especially, as the mobile communication terminal becomes smaller, components used in the mobile communication terminal also become smaller and high-functional.

A voltage controlled oscillator among those components used in the mobile communication terminal is an essential component used for modulation/demodulation of high frequency signal, and requires wide frequency fine tuning range and low phase noise properties.

There are various methods for constructing the voltage controlled oscillator according to the conventional art, and the voltage controlled oscillator generally comprises an LC resonator including a variable capacitor and an inductor and an amplifier for oscillating a certain frequency. The voltage controlled oscillator according to the conventional art will be described as follows with reference to FIG. 1.

As shown therein, the voltage controlled oscillator comprises: an LC resonating circuit including a first variable capacitor C1 and a second variable capacitor C2 receiving control voltages (Vctrl) respectively and a first inductor L1 and a second inductor L2 connected to the first and second variable capacitors C1 and C2 in parallel to oscillate resonance frequency; an amplifier AMP1 for amplifying the resonance frequency generated by the LCD resonance circuit to a certain frequency through positive feedback; and an output buffer 1 for outputting the frequency amplified by the amplifier AMP1 after buffering it. Herein, the phase noise is decided according to the variable capacitors C1 and C2 and Q value of the inductors L1 and L2. Therefore, in order to minimize the phase noise, the variable capacitors C1 and C2 and the inductors L1 and L2 having high Q value should be used.

A varactor using a PIN diode or a capacitor fabricated in a micro machining technology is used as the variable capacitor C1 or C2, and a chip inductor, a wired inductor or an inductor fabricated in the micro machining technology is used as the inductor L1 or L2.

The component having the largest Q value among the capacitors and the inductors is the capacitor and the inductor fabricated in the micro machining technology, the Q value of the capacitor fabricated in the micro machining technology is about 200~300, and the Q value of the inductor fabricated in the micro machining technology is about 100~200.

However, the capacitor and the inductor fabricated in the micro machining technology can not be integrated on a same substrate. That is, in the conventional art, it is not easy to process when the capacitor fabricated in the micro machining technology is used, and accordingly, the chip inductor or the wired inductor is used. In case that the inductor fabricated in the micro machining technology is used, the LC resonator is fabricated using the varactor of the semiconductor substrate.

Therefore, in case that the capacitor fabricated in the micro machining technology is used and the chip inductor is used, an additional chip should be used. Also, in case that the capacitor fabricated in the micro machining technology and the wired inductor are used, reliability of the wired inductor is lowered and the mass production can not be performed. Also, a case that uses the inductor fabricated in the micro machining technology and the varactor having tens of Q value is actively being researched, however, the high frequency property of the inductor and of the varactor is limited.

Also, the method for fabricating the voltage controlled oscillator using the LC resonator is the most generated method, however, it is not easy to fabricate the oscillator and the property of the voltage controlled oscillator is degraded.

On the other hand, an oscillator using a crystal resonator and a surface acoustic wave (SAW) resonator instead of using the LC resonator is widely used as considering the above problems, however, it can not be applied to the voltage controlled oscillator which should control the oscillating frequency using the bias voltage. For example, the resonance frequency of the crystal resonator is decided by cutting direction and thickness of the crystal, and therefore, the resonance frequency can not be controlled by the bias voltage. The resonance frequency of the SAW resonator is decided by a shape of electrode formed on a surface of a piezoelectric material, and therefore, the resonance frequency can not be controlled by the bias voltage.

As described above, the voltage controlled oscillator according to the conventional art should use the capacitor and the inductor having larger Q values in order to minimize the phase noise, however, the capacitor and the inductor fabricated in the micro machining technology having the largest Q value can not be fabricated on same substrate, and therefore, the voltage controlled oscillator can not be realized easily. And in case that the capacitor and the inductor of different forms are used together, the property of the voltage controlled oscillator is degraded.

SUMMARY OF THE INVENTION

Therefore, an object of the present invention is to provide a thin film bulk acoustic resonator having a single chip for controlling resonance frequency.

Another object of the present invention is to provide a thin film bulk acoustic resonator for controlling resonance frequency which is able to minimize phase noise.

Still another object of the present invention is to provide a thin film bulk acoustic resonator for controlling resonance frequency which is able to control the resonance frequency easily according to applied voltage.

Still another object of the present invention is to provide a voltage controlled oscillator using a thin film bulk acoustic resonator for controlling resonance frequency.

To achieve these and other advantages and in accordance with the purpose of the present invention, as embodied and broadly described herein, there is provided a thin film bulk acoustic resonator device for controlling the resonance frequency comprising: a fixed body having a first electrode; a driving body installed to be adjacent to the fixed body, having a second electrode, and moving toward the fixed body by a voltage applied to the first and second electrodes; and a thin film bulk acoustic resonator for generating a resonance frequency and controlling the generated resonance frequency according to change of stress generated by the movement of the driving body.

To achieve these objects of the present invention, there is provided a voltage controlled oscillator comprising: a thin film bulk acoustic resonator controlling the resonance frequency according to the applied voltage; and an amplifier for amplifying the resonance frequency controlled by the thin film bulk acoustic resonator to be a certain frequency and outputting the amplified frequency.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, a preferred embodiment of the thin film bulk acoustic resonator consisting of a single chip for minimizing phase noise by changing resonance frequency easily and a voltage controlled oscillator using the above resonator will be described with reference to FIGS. 2 through 5.

Figure 1:
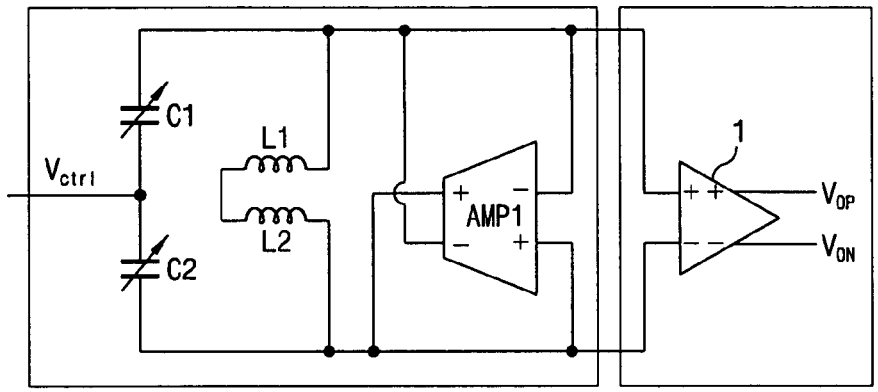
FIG. 1 is a view showing a structure of a voltage controlled oscillator according to the conventional art.
Figure 2:
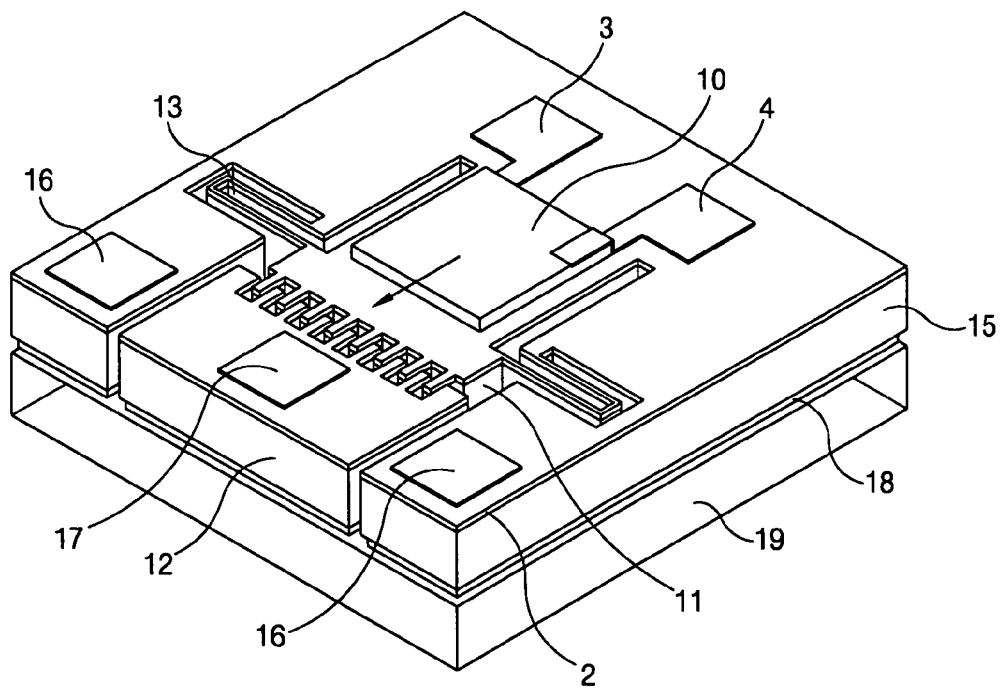
FIG. 2 is a perspective view showing an electrostatically driven voltage controlled thin film bulk acoustic resonator (EDVC TFBAR) according to the present invention.

FIG. 2 is a perspective view showing an electro-statically driven voltage controlled thin film bulk acoustic resonator (EDVC TFBAR) according to the present invention. That is, FIG. 2 shows a thin film bulk acoustic resonator controlling the resonance frequency. Herein, the TFBAR is described in U.S. Pat. Nos. 6,566,979 and 6,484,229, however, the TFBAR described therein is not able to change the resonance frequency as in the present invention.

As shown in FIG. 2, the EDVC TFBAR comprises: a lower substrate 19; a fixed body 12 having one side surface including a plurality of irregular structures and fixed on the lower substrate 19 by a glue 18; an electrode 17 located on upper surface of the fixed body 12; an actuator 15 fixed on the lower substrate 19 by the glue 18 so as to be apart a predetermined distance from three surfaces of the fixed 12 and including an electrode 16 formed on a part of the upper part; a driving body 11 having one surface of irregular structure engaged with the irregular structure of the fixed body 12, and the distance from the irregular structure surface of the fixed body 12 is controlled by stress generated due to voltage difference between the electrodes 17 and 16; an elasticity structure 13 formed on a part of the actuator 15 and physically connected to a part of the driving body 11 in order to return the driving body 11; and a TFBAR 10 located on a predetermined position of the driving body 11 for controlling the resonance frequency according to the stress of the driving body 11. Herein, a layer formed between the fixed body 12 and the electrode 17 is a support layer 2, and the support layer 2 is partially removed.

Hereinafter, the structure of the EDVC TFBAR will be described in detail with reference to FIGS. 3 and 4.

Figure 3:
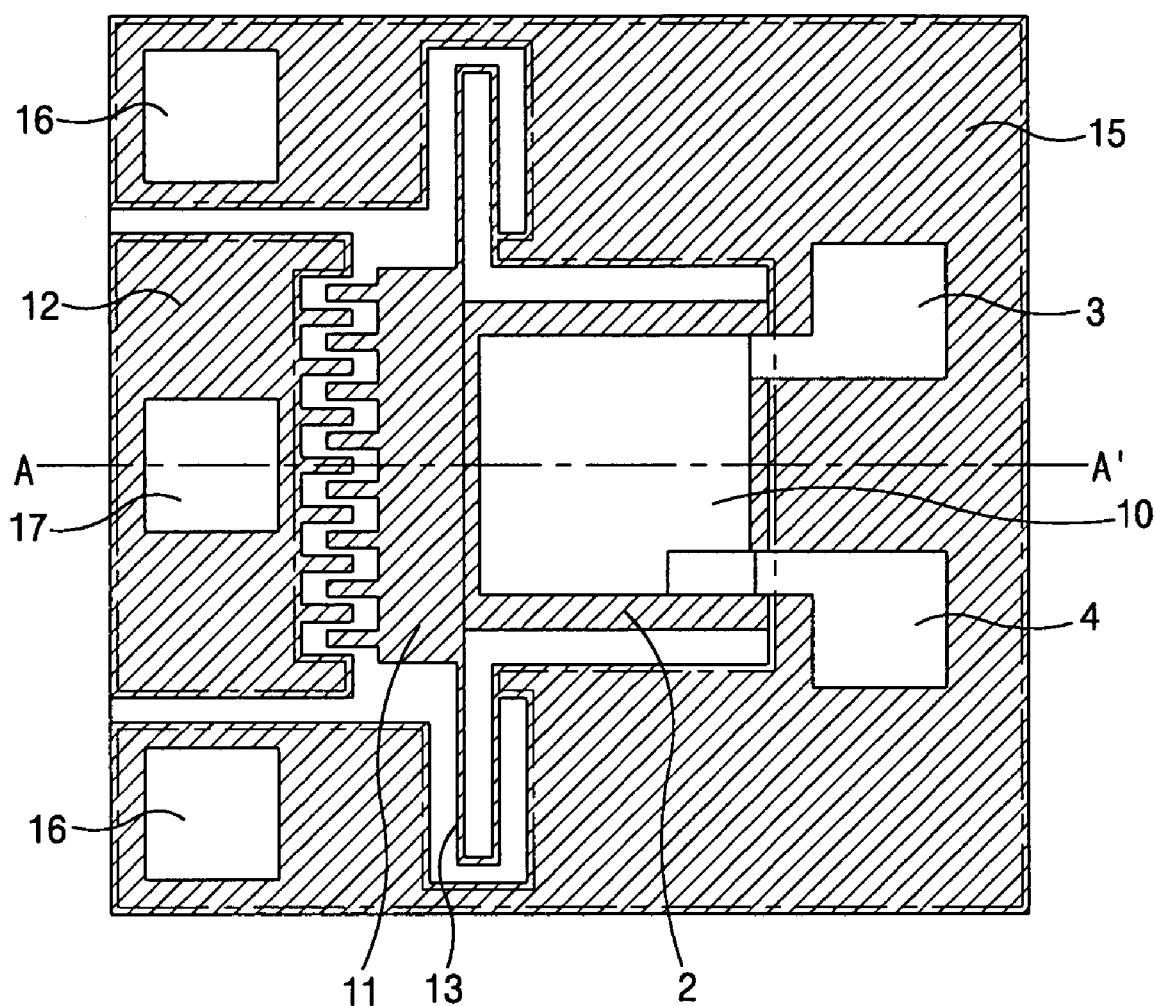
FIG. 3 is a plane view showing the EDVC TFBAR according to the present invention.

FIG. 3 is a plane view showing the EDVC TFBAR according to the present invention.

Figure 4:
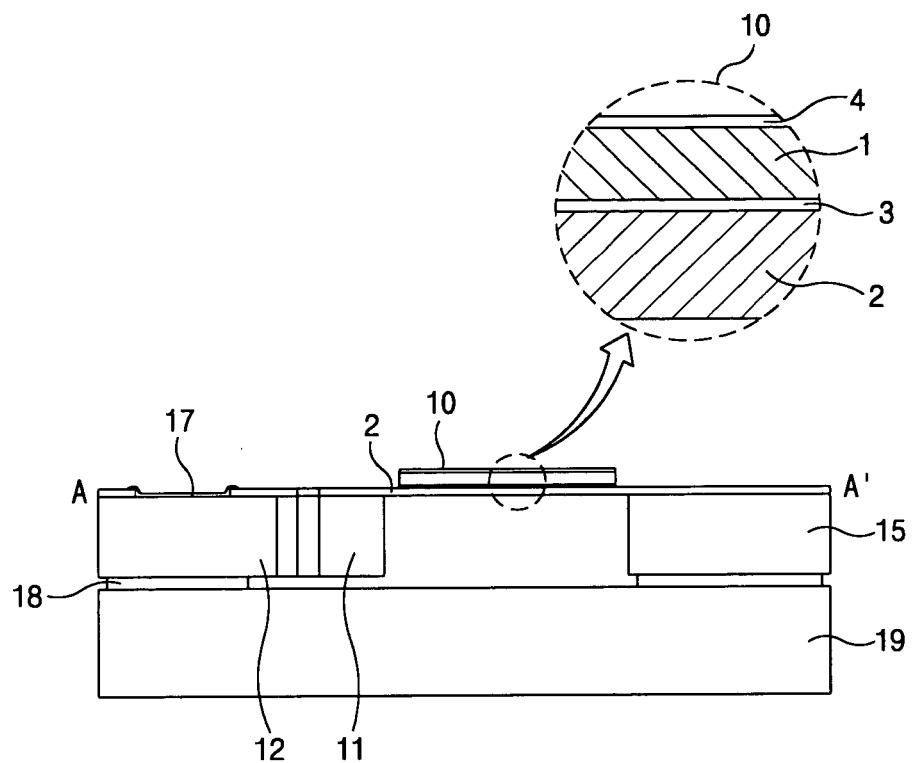
FIG. 4 is a cross-sectional view in line A–A' direction in FIG. 3.

FIG. 4 is a cross-sectional view in line A-A' direction in FIG. 3.

As shown in FIG. 4, the TFBAR 10 comprises a lower electrode 3 formed on the support layer 2, a piezoelectric material 1 formed on the lower substrate 3, and an upper electrode 4 formed on the piezoelectric material 1. It is desirable that the lower electrode 3 and the upper electrode 4 are extended toward the upper part of the actuator 5 and formed as pad shapes so as to apply the voltage easily.

Also, the actuator 15 and the fixed body 12 are fabricated by forming an ONO (Oxide Nitride Oxide) layer or a low stress nitride layer on a silicon substrate, and the TFBAR 10 is supported by the ONO or the low stress nitride layer formed on lower side of the TFBAR 10. Also, the substrate on lower part of the TFBAR 10 is removed to form a membrane TFBAR 10 for preventing acoustic wave from being lost.

It is desirable that a junction material such as a silver paste is used as the glue 18, and the actuator 15 and the fixed body 12 are fixed by the glue 18.

Also, the elasticity structure 13 is pulled by residual stress generated on the irregular structure surface of the driving body and the irregular structure surface of the fixed body by the voltage applied to the electrodes 16 and 17, and when the stress is removed, the structure 13 is returned to the original status. Herein, it is desirable that the elasticity structure 13 is configured to have a bent structure of narrow width in order to return the driving body 11 into the original status.

Hereinafter, operation of the EDVC TFBAR according to the present invention will be described in detail.

First, the TFBAR 10 generates a predetermined resonance of frequency by the voltage applied to the lower electrode 3 and the upper electrode 4, and Q value of the resonance is about 1000~10000 that is much larger than that of LC resonating. Also, the TFBAR can be mass-produced with minimum expense, and can be realized in a minimum size. Also, the TFBAR 10 can be realized in High Q value, and can be used in a micro frequency band.

After that, the voltage is applied to the electrode 16 located on upper part of the actuator 15 and to the electrode 17 located on upper part of the fixed body 12 in order to make the generated resonance to a certain frequency.

The respective electrodes 16 and 17 have predetermined electric charges for the applied voltage, and polarities thereof are electrificated to be Q and −Q. At that time, electrostatic attractive force is applied between the fixed body 12 and the actuator 15 and the driving body 11 connected to the actuator 15, and the driving body 11 is moved toward the fixed body 12 due to the electrostatic attractive force.

The force of moving the driving body 11 toward the fixed body 12 is applied to both the driving body 11 and the fixed body 12 as divided with a predetermined ratio, and is applied toward the side surface direction as arrow part in FIG. 2.

The force applied toward the side surface direction changes the stress between the fixed body 12 and the driving body 11 (that is, increases the stress), and the resonance frequency of the TFBAR 10 is changed according to the change of the stress. At that time, the changed resonance frequency can be represented in following equation 1.

$$\delta f/f = a_0 + a_1 \delta S + a_2 \delta S^2 + a_3 \delta S^3 \qquad \text{equation 1}$$

Above f represents the resonance frequency, $\delta f$(delta f) represents difference between the resonance frequency, $\delta S$ is difference between residual stress, and a means the constant. Therefore, the resonance frequency of the TFBAR 10 can be controlled by controlling the difference between voltages applied to the electrodes 16 and 17.

Hereinafter, a fabrication method of the EDVC TFBAR according to the present invention will be described.

First, the low stress nitride layer or the ONO layer in which an oxide layer/a nitride layer/an oxide layer are deposited is deposited on upper or lower part of the silicon substrate to form the support layer 2.

The lower electrode 3 is formed on upper part of the support layer 2 located on the upper part of the silicon substrate, the piezoelectric material 1 is formed on the lower electrode, and the upper electrode 4 is deposited on the piezoelectric material 1, and thereby, the TFBAR 10 located on a part of the support layer 2 is formed.

It is desirable that the lower electrode 3 and the upper electrode 4 of the TFBAR 10 is formed using one of Au/Ti, Au/Cr, Al, Pt/Ti, Pt/Cr and Pt, and it is desirable that ZnO, AIN or PZT is used as the piezoelectric material.

After forming the TFBAR 10, the support layer located on bottom surface of the silicon substrate is removed, and the exposed bottom surface of the substrate is selectively etched to form the TFBAR 10 as a membrane structure. In addition, the silicon substrate and a part of the support layer located thereon are selectively removed, and thereby, the fixed body 12, the driving body 11, the actuator 15 and the elasticity structure 13 are respectively formed as shown in FIG. 2. Herein, the elasticity structure 13 can be formed in various structures for returning the driving body to the original status.

After that, the bottom surface of the silicon substrate constructing the fixed body 12 and the actuator 15 and the lower substrate 19 are joined using the glue 18 to complete the fabrication process. Herein, a quartz substrate can be used as the lower substrate 19 besides the silicon substrate.

On the other hand, the surfaces of the fixed body 12 and the driving body 11 facing each other are formed to have a plurality of irregular structures to apply the electrostatic attractive force effectively for the voltages applied to the electrodes 16 and 17 by enlarging the area facing each other. That is, as the areas facing each other are enlarged, the generated electrostatic force is increased, and the desired resonance frequency can be obtained by the stress generated due to the large electrostatic force. Herein, the areas of the fixed body 12 and the driving body 11 facing each other can be formed to have the irregular structure, and also, can be formed to be a protruded portion and a recessed portion, and can be formed as a sawtooth structure.

Hereinafter, construction of the voltage controlled oscillator applied by the EDVC TFBAR according to the present invention will be described with reference to FIG. 5.

Figure 5:
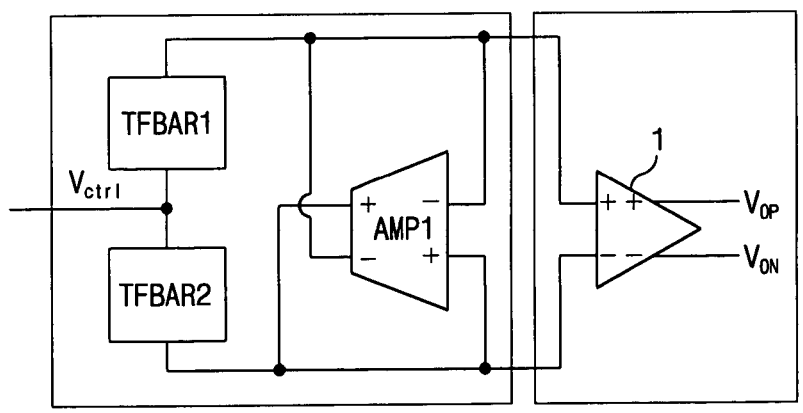
FIG. 5 is a block diagram showing a structure of a voltage controlled oscillator applied by the EDVC TFBAR according to the present invention.

FIG. 5 is a block diagram showing the voltage controlled oscillator applied by the EDVC TFBAR according to the present invention.

As shown therein, the voltage controlled oscillator applied by the EDVC TFBAR comprises: a first EDVC TFBAR (TFBAR1) and a second EDVC TFBAR (TFBAR2) generating certain resonance frequency according to controlling voltages (Vctrl) applied to the electrodes 16 and 17; an amplifier (AMP1) for amplifying the resonance frequency generated by the TFBAR1 and TFBAR2 through a positive feedback; and an output buffer 1 for buffering and outputting the frequency amplified by the amplifier AMP1. Therefore, the phase noise can be minimized using the EDVC TFBAR having large Q value according to the present invention, and the resonance frequency is changed by changing the controlling voltage (Vctrl) to realize the voltage controlled oscillator which is able to output the desired frequency.

As described above, the present invention realizes the thin film bulk acoustic resonator which is able to change the resonance frequency according to the stress which is changed according to the controlling voltage, and realizes the voltage controlled oscillator using the thin film bulk acoustic resonator having the large Q value. Therefore, the phase noise of the voltage controlled oscillator can be minimized.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A thin film bulk acoustic resonator device for controlling resonance frequency, comprising:
    a fixed body having a first electrode;
    a driving body installed to be adjacent to the fixed body, having a second electrode, and moving toward the fixed body by a voltage applied to the first and second electrodes; and
    a thin film bulk acoustic resonator for generating a resonance frequency and controlling the generated resonance frequency according to a change of stress generated by the movement of the driving body.

2. The resonator device of claim 1, wherein the thin film bulk acoustic resonator is located on an upper part of the driving body.

3. The resonator device of claim 1, wherein the driving body is moved toward the fixed body by an electrostatic force generated by the voltage applied to the first and second electrodes.

4. The resonator device of claim 1, wherein surfaces of the fixed body and the driving body facing each other are respectively formed to be a plurality of protruded portions and a plurality of recessed portions, and the protruded portion and the recessed portion of the fixed body and the recessed portion and the protruded portion of the driving body are engaged with each other.

5. The resonator device of claim 1, wherein a protruded portion and the recessed portion of the fixed body and a recessed portion and a protruded portion of the driving body are engaged with each other by an electrostatic force generated by the voltages applied to the first and second electrodes.

6. The resonator device of claim 1, wherein surfaces of the fixed body and the driving body facing each other are formed to have a plurality of irregular structures, and the irregular structures are engaged with each other.

7. The resonator device of claim 1, wherein the driving body is returned to original status by an elasticity structure.

8. The resonator device of claim 1 further comprising an amplifier for amplifying the resonance frequency controlled by the thin film bulk acoustic resonator and for outputting the amplified frequency.

\* \* \* \* \*